United States Patent
Chang et al.

(10) Patent No.: US 7,083,882 B2
(45) Date of Patent: Aug. 1, 2006

(54) COATING METHOD FOR A COLOR FILTER AND ALIGNING-ASSEMBLING METHOD BY USING THE SAME

(75) Inventors: Chih-Neng Chang, Taipei (TW); Jui Hung Yen, Shulin (TW); Wen Hu Wang, Taipei (TW); Ke-Shu Chin, Junghe (TW); An-Hwa Yu, Shinjuang (TW)

(73) Assignee: Prodisc Technology Inc., Taipei (TW)

( * ) Notice: Subject to any disclaimer, the term of this patent is extended or adjusted under 35 U.S.C. 154(b) by 214 days.

(21) Appl. No.: 10/386,463

(22) Filed: Mar. 13, 2003

(65) Prior Publication Data

US 2004/0038137 A1 Feb. 26, 2004

(30) Foreign Application Priority Data

| Aug. 22, 2002 | (TW) | ................................ 91119062 A |
| Oct. 9, 2002 | (TW) | ................................ 91123309 A |
| Oct. 24, 2002 | (TW) | ................................ 91124813 A |

(51) Int. Cl.
*G02B 5/20* (2006.01)

(52) U.S. Cl. ............................................ 430/7; 430/22
(58) Field of Classification Search .................... 430/7, 430/22

See application file for complete search history.

(56) References Cited

U.S. PATENT DOCUMENTS

| 4,659,226 A | * | 4/1987 | Elabd .......................... 356/401 |
| 4,777,117 A | * | 10/1988 | Murata et al. .............. 430/293 |
| 2003/0020851 A1 | * | 1/2003 | Kim et al. ................... 349/106 |

* cited by examiner

*Primary Examiner*—John A. McPherson
(74) *Attorney, Agent, or Firm*—Birch, Stewart, Kolasch & Birch, LLP

(57) ABSTRACT

A coating method for a color filter, including the steps of: coating a first photoresist layer on a substrate; forming at least a aligning pattern and a first color film pattern on the first photoresist layer by exposure and development; coating a first dye on the aligning pattern and the first color film pattern; stripping the first photoresist layer; coating a second photoresist layer on the substrate, wherein the aligning pattern and the first color film pattern are formed on the substrate; aligning position by using the aligning pattern of the substrate; forming a second color film pattern on the second photoresist layer by exposure and development; coating a second dye on the second color film pattern; and stripping the second photoresist layer. The invention also discloses an aligning-assembling method for a color wheel, which includes the color filter.

13 Claims, 13 Drawing Sheets

COATING METHOD FOR A COLOR FILTER AND ALIGNING-ASSEMBLING METHOD BY USING THE SAME

BACKGROUND OF THE INVENTION

1. Field of the Invention

The invention relates to a coating method for a color filter and an aligning-assembling method for a color wheel and, in particular, to the coating method for the color filter and the aligning-assembling method for the color wheel, both of which are used in projection technology.

2. Description of the Related Art

In recent years, demand has arisen for a color filter used in a device such as a liquid crystal display or a color wheel. The color filter separates the light into three fundamental colors (i.e. red, green and blue), and then the color filter further mixes these three fundamental colors to create the different colors in different ratios.

In general, coating three fundamental colors on a substrate makes the color filter. The shape, the size and the arrangement of the color filter are adjusted according to practical needs. For example, the color filter is composed of three sectors of red, green and blue. Also, the color filter is a ring-shaped filter composed of one transparent block and three or more filter sectors of red, green and blue.

In the conventional color filter coating technology, a pattern on a mask is transferred to a glass substrate by exposure and development. Herein, the position of the mask and the substrate is aligned by mechanical alignment. Because the accuracy of the mechanical alignment is insufficient, the error in the coating position may increase. Further, the reliability of the color filter may also decrease.

In addition, the color wheel 6 mainly includes a motor 61 and a color filter 62. As shown in FIG. 1, the color filter 62 is mounted on the axis of the motor 61. The color filter 62 rotates together with the motor 61 and generates the light rays of several colors.

In the conventional aligning-assembling method for the color wheel, the color filter and the motor are set on the fixing jig, and then both of them are aligned by a mechanical method. After alignment, the color filter and the motor are assembled to create the color wheel. Generally, the motor rotates at a speed higher than 7200 rpm. When the rotation center of the motor is away from the central axis of the rotation shaft (i.e., when the rotation center is not located on the central axis of the rotation shaft), the operation of the color wheel may be adversely influenced by vibration and noise. Further, the operational reliability of the color wheel may decrease. For above-mentioned reasons, the accuracy of aligning the color wheel is very critical. However, the accuracy of the mechanical alignment is insufficient, and the speed of the mechanical alignment is also very slow. Therefore, the mechanical alignment is inapplicable in industrial applications.

It is therefore an important objective of the invention to provide a coating method for the color filter and an aligning-assembling method for the color wheel to solve the above-mentioned problem.

SUMMARY OF THE INVENTION

An objective of the invention is to provide a coating method for a color filter, which may have the advantages of increasing the accuracy, increasing operational reliability, and reducing the fabrication time.

Another objective of the invention is to provide an aligning-assembling method for a color wheel, which has the advantages of increasing the accuracy, and reducing the fabrication time.

To achieve the above-mentioned objectives, the invention provides a coating method for a color filter, including the steps of: coating a first photoresist layer on a substrate; forming at least an aligning pattern and a first color film pattern on the first photoresist layer by exposure and development; coating a first dye on the aligning pattern and the first color film pattern; stripping the first photoresist layer; coating a second photoresist layer on the substrate, wherein the aligning pattern and the first color film pattern are formed on the substrate; aligning position by using the aligning pattern of the substrate; forming a second color film pattern on the second photoresist layer by exposure and development; coating a second dye on the second color film pattern; and stripping the second photoresist layer.

To achieve the above-mentioned objectives, the invention provides an aligning-assembling method for a color wheel. The method includes the following steps. First, at least a first aligning pattern is formed on a housing of a motor. Then, at least a second aligning pattern of the color filter formed above the housing is provided. Afterward, the first aligning pattern and the second aligning pattern are aligned by an optical alignment. Finally, the color filter and the housing are assembled.

As mentioned above, the invention provides a coating method for the color filter and an aligning-assembling method for the color wheel, in both of which the optical alignment is used. Compared to the prior art, the accuracy of the alignment may be increased and the operational reliability of the color filter and the color wheel may also be increased. Further, the fabrication time of the color filter and the color wheel may be reduced. Moreover, the fabrication cost may also be reduced. In addition, the vibration and noise caused by the color wheel may be reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and in the accompanying drawings, which are given by way of illustration only, and thus are not limitative of the present invention, and wherein.

DETAILED DESCRIPTION OF THE INVENTION

The invention will be apparent from the following detailed description, which proceeds with reference to the accompanying drawings, wherein the same references relate to the same elements.

Figure 1:
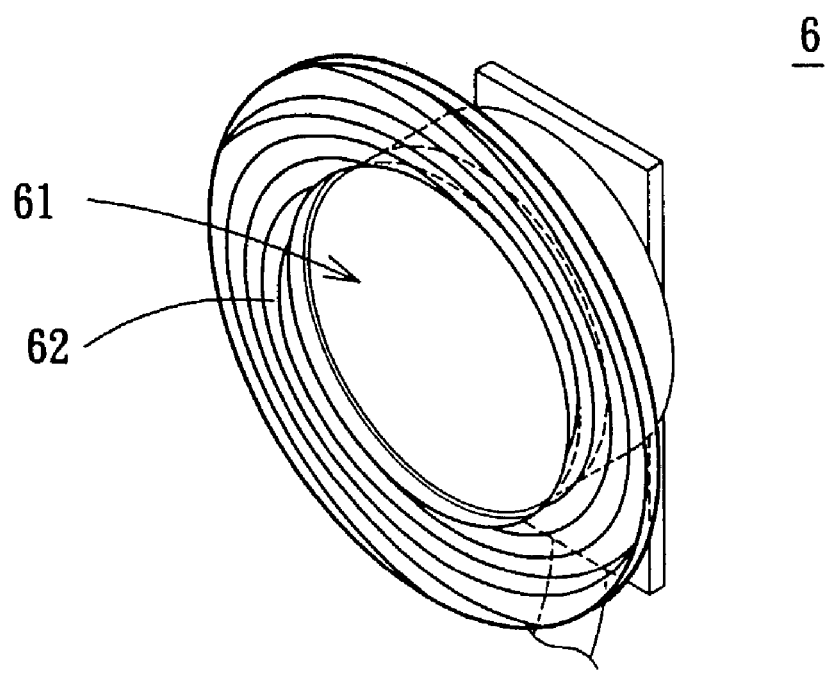
FIG. 1 is a schematic illustration that shows a pictorial view of a conventional color wheel.
Figure 2:
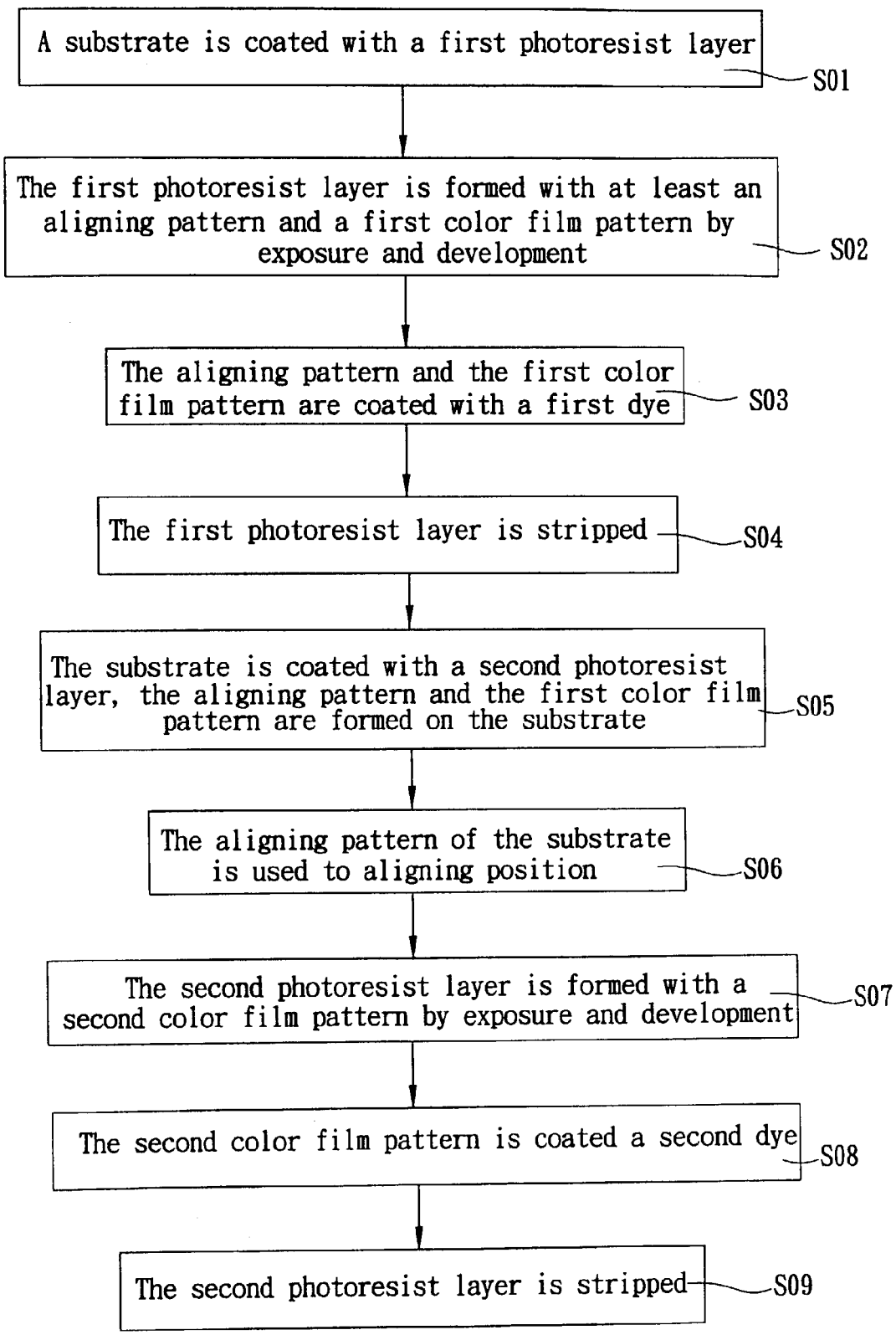
FIG. 2 is a block diagram of the coating method for the color filter according to the first embodiment.

As shown in FIG. 2, a first embodiment of the disclosed coating method for a color filter includes the following steps. First, a substrate is coated with a first photoresist layer (S01). The first photoresist layer is formed with at least an aligning pattern and a first color film pattern by exposure and development (S02). The aligning pattern and the first color film pattern are coated with a first dye (S03). Then, the first photoresist layer is stripped (S04). Afterwards, the substrate is coated with a second photoresist layer, herein, the aligning pattern and the first color film pattern are formed on the substrate (S05). The aligning pattern of the substrate is used to align the position (S06). The second photoresist layer is formed with a second color film pattern by exposure and development (S07). The second color film pattern is coated a second dye (S08). Finally, the second photoresist layer is stripped (S09).

Figure 3A:
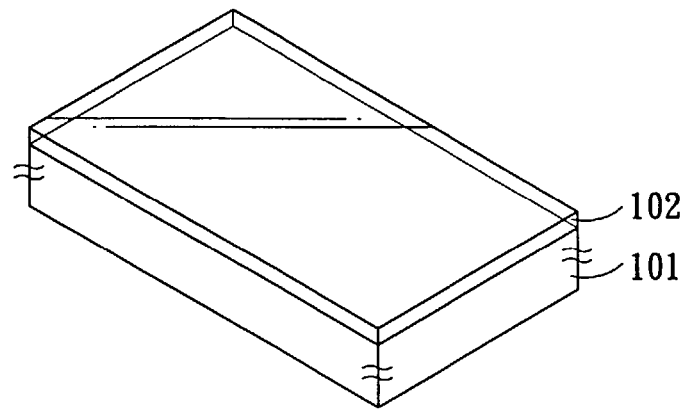
FIGS. 3A to 3I are partially enlarged views that schematically illustrate the first embodiment.

Referring to FIG. 3A, the substrate 101 is coated with a first photoresist layer 102 in step S01. The first photoresist layer 102 is made of a mixture of a resin, a sensitizer and the solvent. Herein, the first photoresist layer 102 is a negative photoresist layer. Namely, when a specific wavelength light exposes the first photoresist layer 102, the first photoresist layer 102 becomes a cross-linking structure, and is insolvable in a developing solution.

Figure 3B:
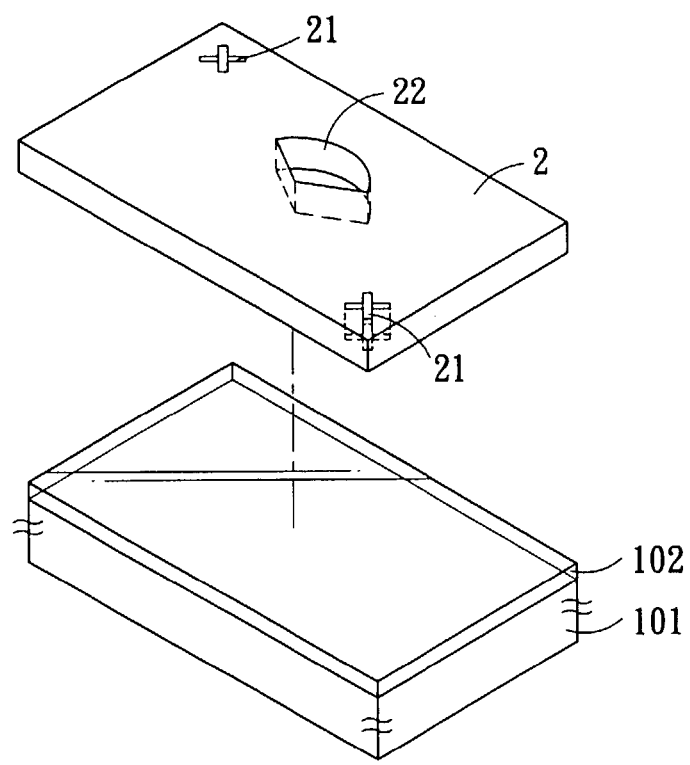

Referring to FIG. 3B, a mask 2 is set above the substrate 101. Herein, an aligning pattern 21 (as shown in FIG. 3B) and a first color film pattern 22 (as shown in FIG. 3B) are formed on the mask 2. Then, the aligning pattern 21 and the first color film pattern 22 on the mask 2 are transferred to the first photoresist layer 102 by being exposed to a specific wavelength of light.

Figure 3C:
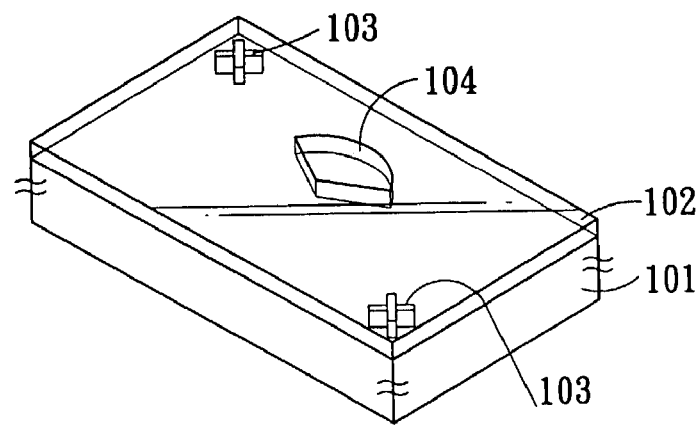

Next, referring to FIG. 3C, the first photoresist layer 102 is formed with at least an aligning pattern 103 (as shown in FIG. 3C) and a first color film pattern 104 (as shown in FIG. 3C) by exposure and development in step S02.

In the current embodiment, the aligning pattern 103 may be any shape and any size. The number and the type of the aligning pattern 103 are one or more.

Referring again to FIG. 3C, the exposed part of the first photoresist layer 102 is then removed by using a developing solution.

In step S03, the aligning pattern 103 and the first color film pattern 104 are coated with the first dye (ex: red). The first color film pattern 106 coated with the first dye and the aligning pattern 105 coated with the first dye are formed on the substrate 101.

Figure 3D:
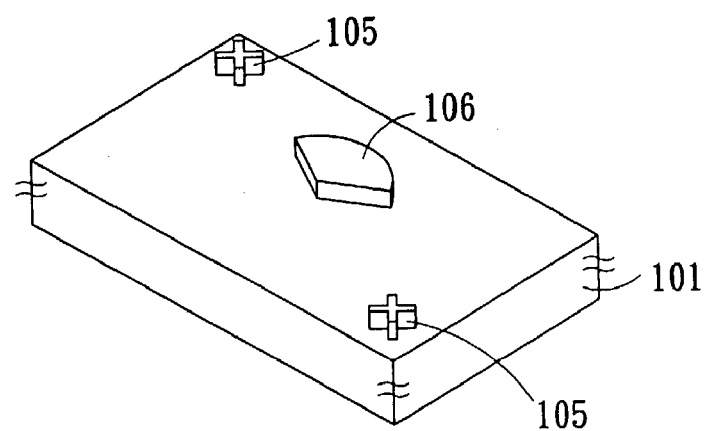

The first photoresist layer 102 is stripped in step S04. In the current embodiment, the first photoresist layer 102 is removed from the substrate 101 by a wet-stripped method or a dry-stripped method. The first color film pattern 106 coated with the first dye and the aligning pattern 105 coated with the first dye are formed on the substrate 101, as shown in FIG. 3D.

Figure 3E:
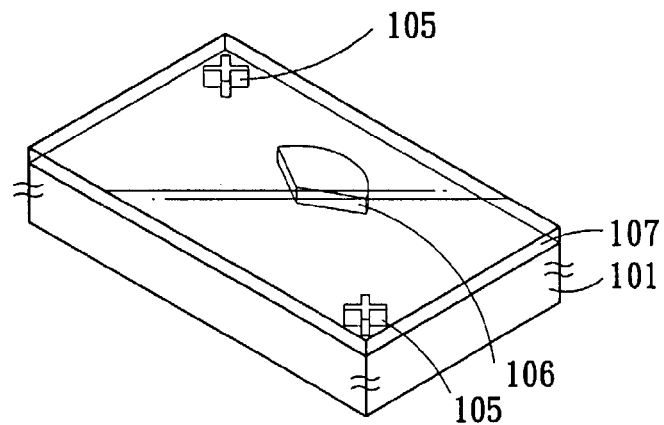

As shown in FIG. 3E, the substrate 101 is coated with a second photoresist layer 107 in step S05. Herein, the aligning pattern 105 coated with the first dye and the first color film pattern 106 coated with the first dye are formed on the substrate 101. In the current embodiment, the second photoresist layer 107 has the same feature and function as the first photoresist layer 102.

Figure 3F:
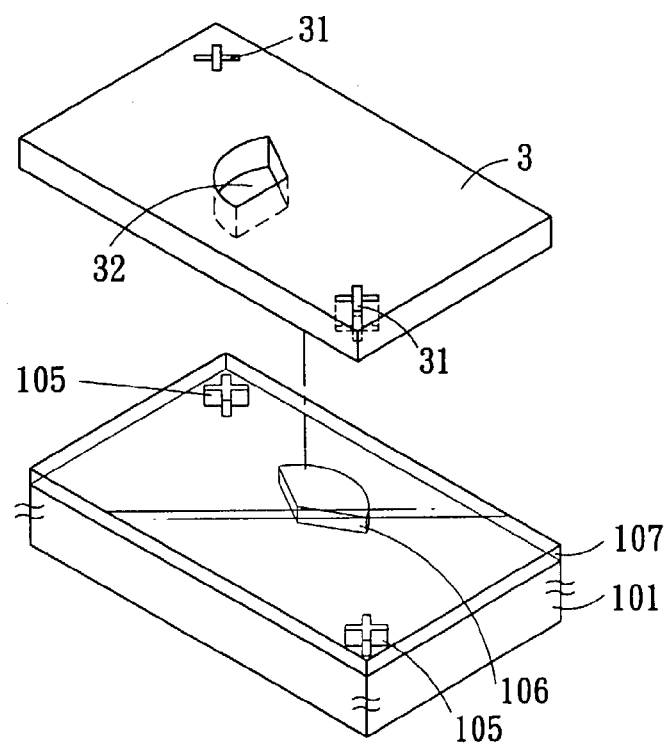

As shown in FIG. 3F, the aligning pattern 105 coated with the first dye is used to align the position in step S06. In other words, the aligning pattern 105 coated with the first dye on the substrate 101 is aligned with an aligning pattern 31 on a mask 3 by an optical process. Herein, a second color film pattern 32 is also formed on the mask 3.

Figure 3G:
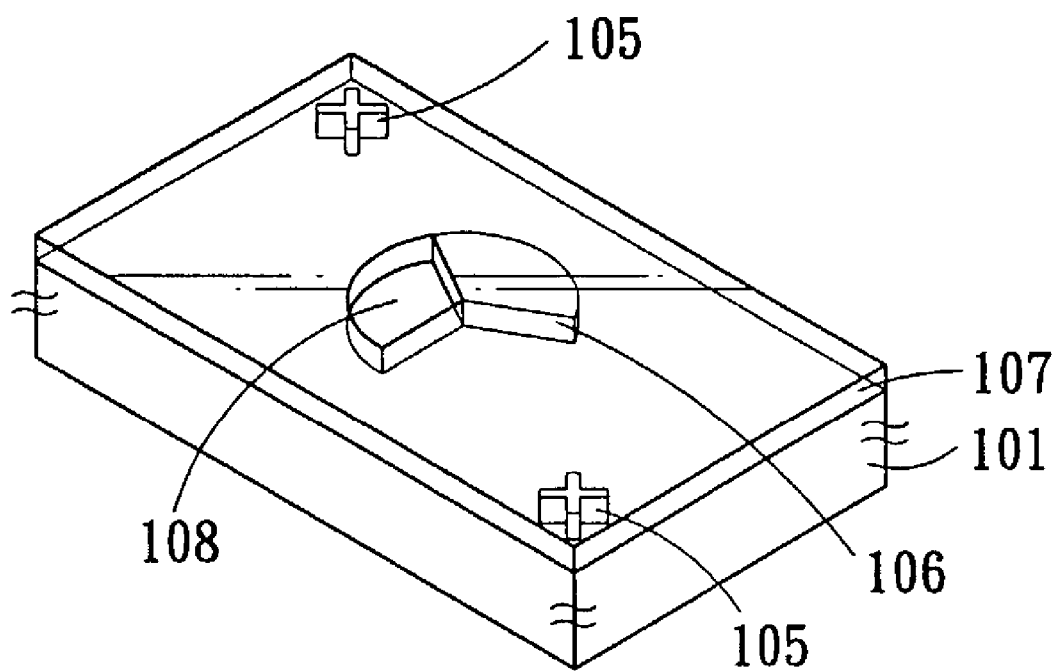

Next, as shown in FIG. 3G, the second photoresist layer 107 is formed with a second color film pattern 108 by exposure and development in step S07.

In step S08, the second color film pattern 108 is coated a second dye (ex: green).

Figure 3H:
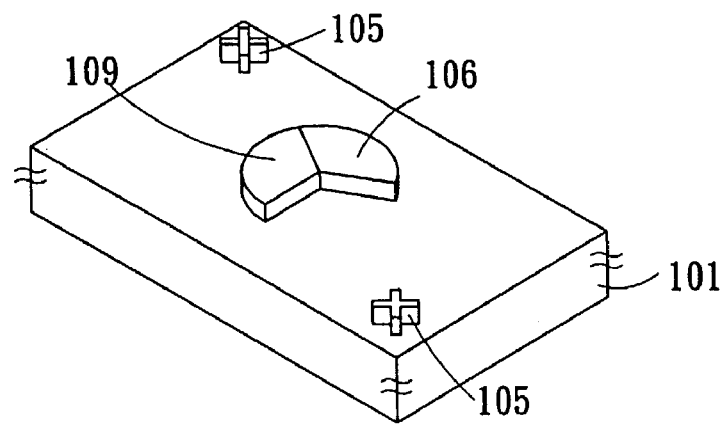
Figure 3I:
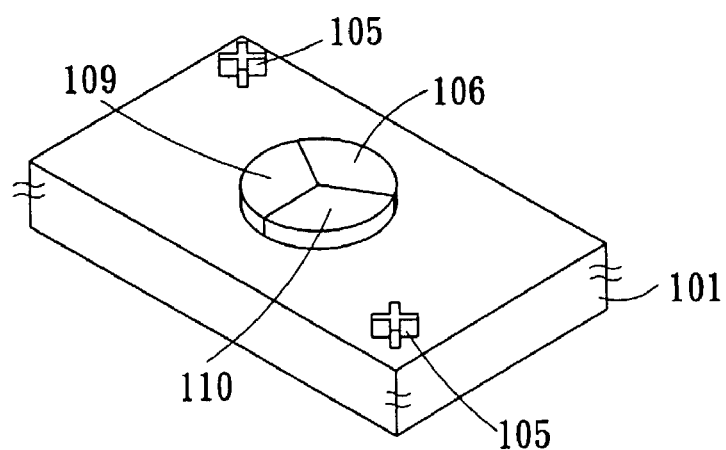

As shown in FIG. 3H, the second photoresist layer 107 stripped in step S09 is using the same way in step S04, so that the first color film pattern 106 coated with the first dye, the second color film pattern 109 coated with the second dye and the aligning pattern 105 coated with the first dye are formed on the substrate 101.

Finally, repeating step SOS to step S08, the third color film pattern 110 coated with the third dye (ex: blue) is formed on the substrate 101, as shown in FIG. 31.

In the current embodiment, the color filter, which is composed of the first color film pattern 106 coated with the first dye, the second color film pattern 109 coated with the second dye, and the third color film pattern 110 coated with the third dye are all formed by the above-mentioned method.

Figure 4:
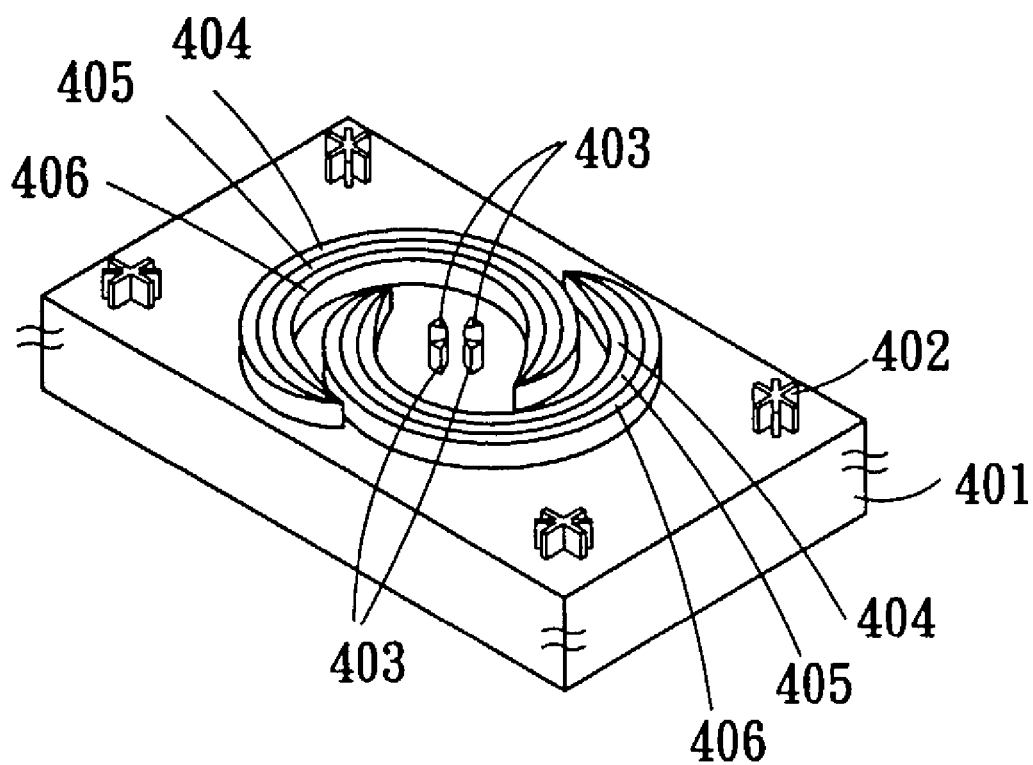
FIG. 4 is a partially enlarged view that schematically illustrates the second embodiment.

Of course, the different shape and the different style of the color filter 1 may also be made in the same way, as shown in FIG. 4.

Referring again to FIG. 4, a second embodiment of the invention provides a substrate 401 on which the first color film pattern 404 coated with the first dye, the second color film pattern 405 coated with the second dye, the third color film pattern 406 coated with the third dye, and the aligning pattern 402, 403 are formed.

In the current embodiment, as shown in FIG. 4, the aligning pattern 402 is used to avoid the displacement of the horizontal direction and the vertical direction in the alignment. Herein, the aligning pattern 402 is located on one side of those color film pattern 404, 405 and 406.

In addition, the aligning pattern 403 is used to avoid the displacement of rotation (counterclockwise or clockwise) in the alignment. Referring again to FIG. 4, the aligning pattern 403 is located at the relative center of those color film pattern 404, 405 and 406.

In the current embodiment, the number and the size of the aligning patterns 402, 403 are adjusted according to practical needs.

Figure 5:
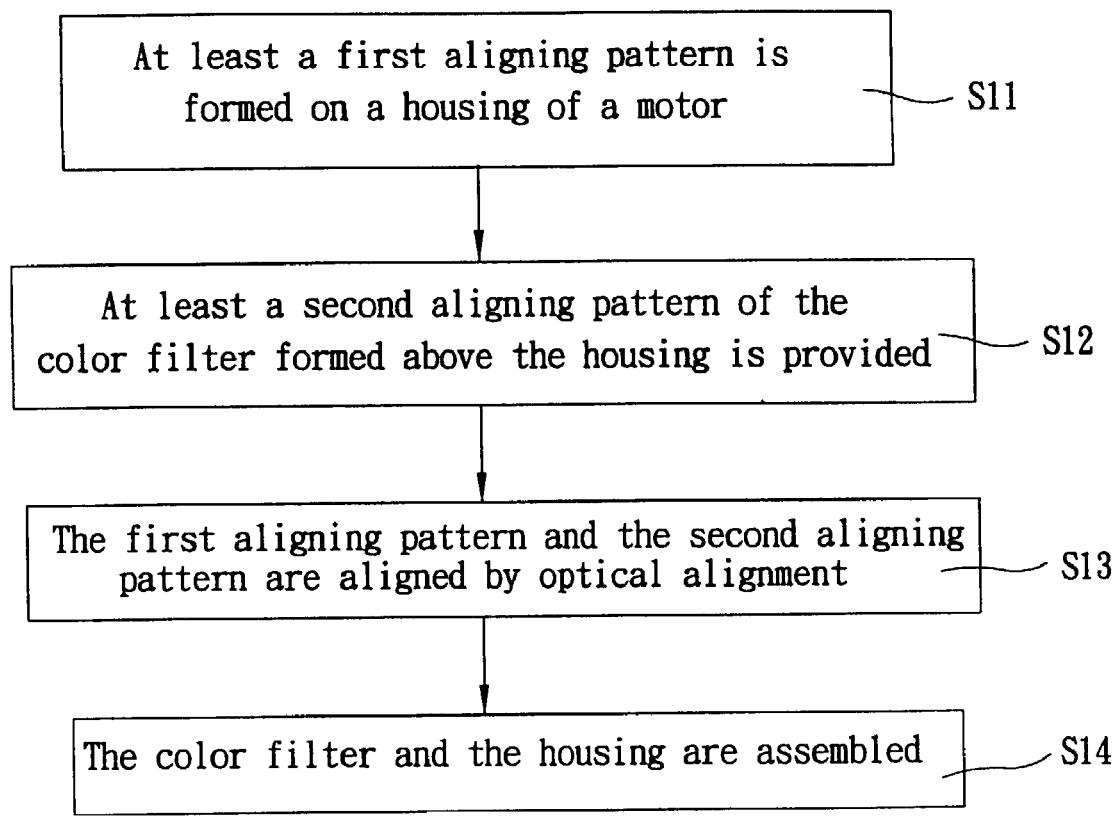
FIG. 5 is a block diagram of the aligning-assembling method for the color wheel according to the third embodiment.

Additionally, as shown in FIG. 5, a third embodiment of the invention provides an aligning-assembling method for a color wheel 5, which includes a color filter 52. The method includes following steps. First, at least a first aligning pattern is formed on a housing of a motor (S11). Then, at least a second aligning pattern of the color filter formed above the housing is provided (S12). Afterwards, the first aligning pattern and the second aligning pattern are aligned by optical alignment (S13). Finally, the color filter and the housing are assembled (S14).

Figure 6A:
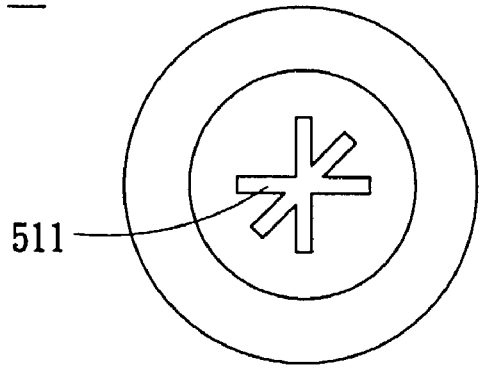
FIGS. 6A to 6C are schematic elevations that schematically illustrate the housing of the third embodiment.
Figure 6B:
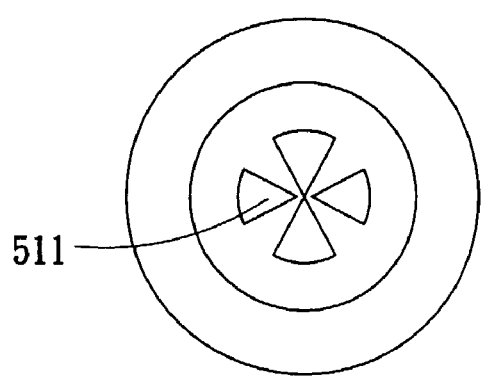
Figure 6C:
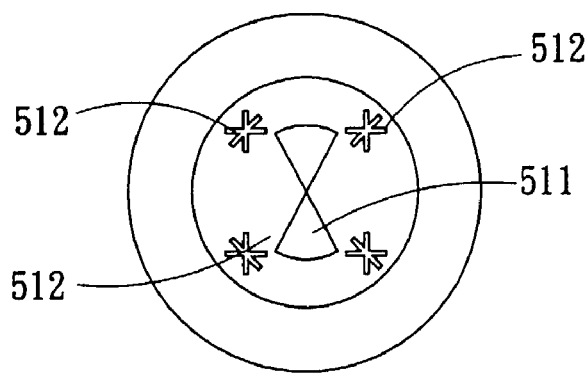

As shown in FIG. 6A, at least one first aligning pattern 511 is formed on the housing 51 in step S11. Herein, the first aligning pattern 511 may include a cross pattern which is used to avoid the displacement of the horizontal direction and the vertical direction in the alignment. Additionally, the first aligning pattern 511 may also include two sector patterns located opposite each other, as shown in FIG. 6B. These sector patterns are used to avoid the displacement of the rotation in the alignment. Of course, the housing 51 further includes at least a third aligning pattern 512, so that the aligning pattern on the housing 51 may both include the cross pattern and the sector pattern, as shown in FIG. 6C.

Figure 7A:
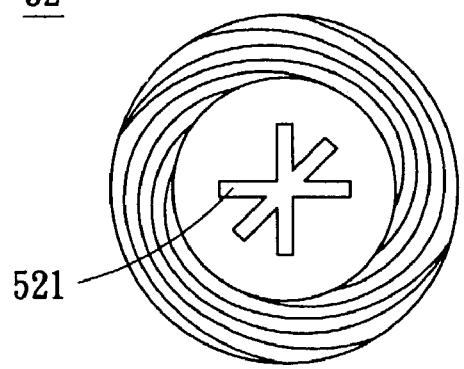
FIGS. 7A to 7C are schematic elevations that schematically illustrate the color filter of the third embodiment.
Figure 7B:
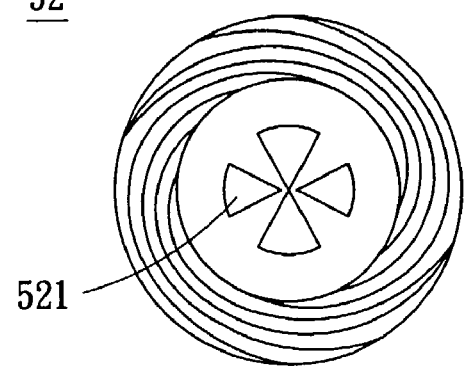
Figure 7C:
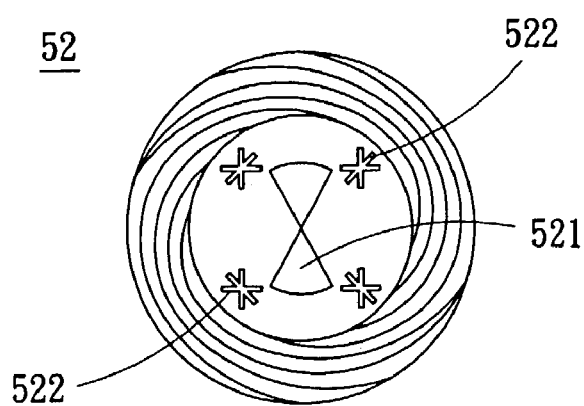

In step S12, at least a second aligning pattern 521 of the color filter 52 formed above the housing 51 is provided. Herein, the second aligning pattern 521 may include a cross pattern, as shown in FIG. 7A. Additionally, the second aligning pattern 521 may also include two sector patterns located opposite each other, as shown in FIG. 7B. Of course, the color filter 52 further includes at least a fourth aligning pattern 522, so that the aligning pattern of the color filter 52 both includes the cross pattern and the sector pattern, as shown in FIG. 7C.

In the current embodiment, the cross pattern and the sector pattern of the second aligning pattern 521 and the fourth pattern 522 have the same features and functions as the first aligning pattern 511 and the third aligning pattern 512, detailed description thereof will be omitted.

Herein, the second aligning pattern 521 and the fourth aligning pattern 522 of the color filter 52 are formed by the same coating method that mentions in the first and the second embodiment. In other words, when the color film patterns are coated on the substrate, the second align pattern 521 and the fourth aligning pattern 522 are also coated on the substrate.

Figure 8A:
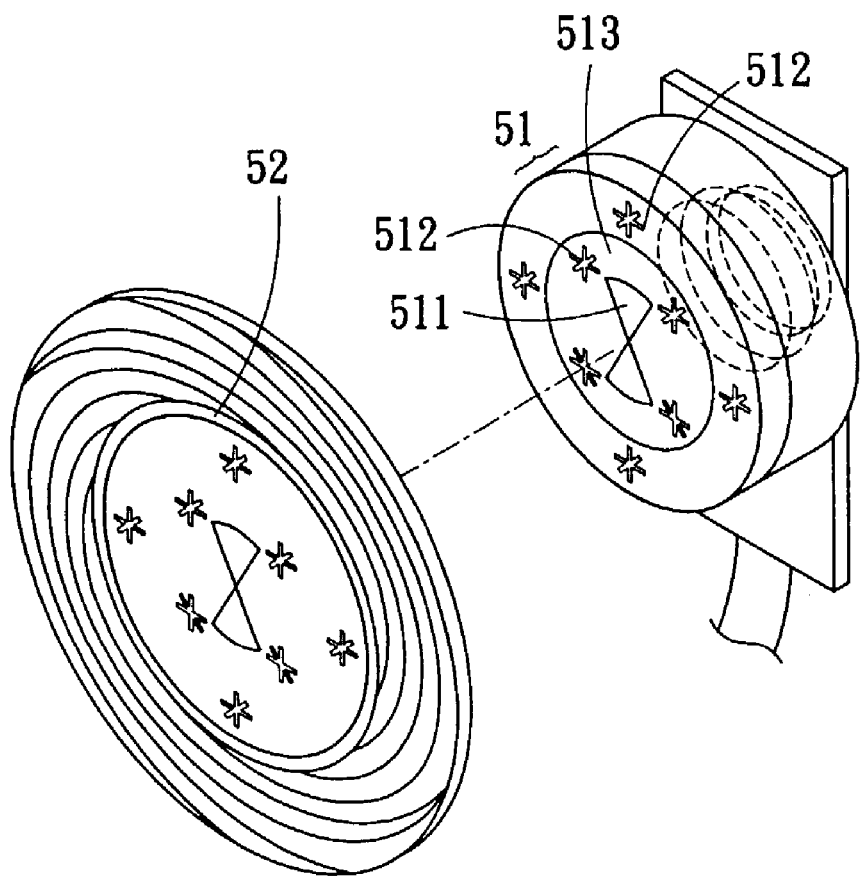
FIGS. 8A and 8B schematically illustrate the third embodiment.
Figure 8B:
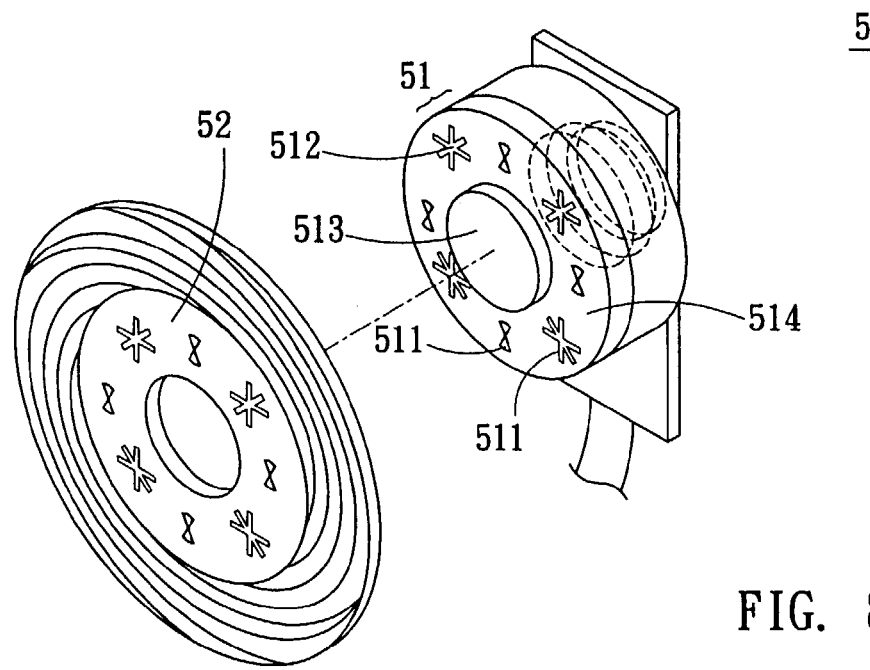

In the current embodiment, the first aligning pattern 511 and the third aligning pattern 512 are formed on the housing 51, and these patterns 511, 512 are adjusted according to the style of the axis part 513 of the housing 51. For example, as shown in FIG. 8A, when the housing 51 is a disc-shaped housing, the first aligning pattern 511 and the third aligning pattern 512 may be formed on the surface of the housing 51 that contacts with the color filter 52. However, when the housing 51 is a hat-shaped housing, the first aligning pattern 511 and the third aligning pattern 512 may only be formed on the surface of the housing 51 except the axis part 513 (i.e. outer part 514), as shown in FIG. 8B.

Herein, the number, the size and the position of the aligning patterns 511, 512, 521 and 522 are adjusted according to practical needs.

Further, in step S13, the first aligning pattern 511 and the second aligning pattern 521 are aligned by an optical alignment.

Figure 9:
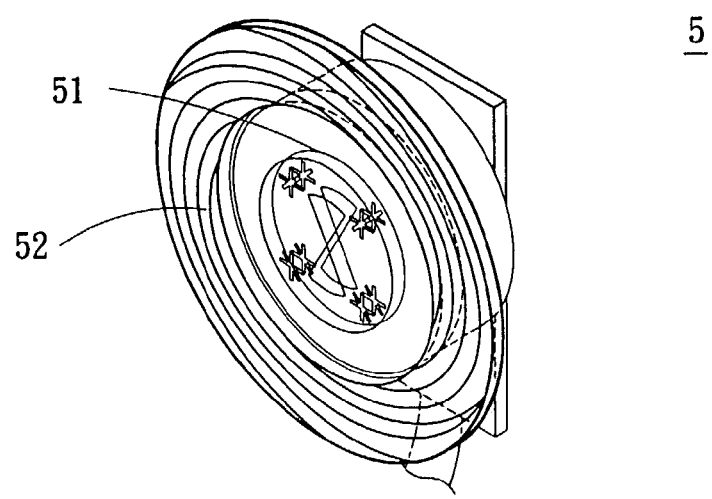
FIG. 9 is a pictorial view of the color wheel according to the third embodiment.

As shown in FIG. 9, the color filter 52 and the housing 51 are assembled to creative a color wheel 5 in step S14.

The invention provides a coating method for the color filter and an aligning-assembling method for the color wheel, in both of which the optical alignment is used. Compared to the prior art, the accuracy of the alignment may be increased and the operational reliability of the color filter and the color wheel may also be increased. Further, the fabrication time of the color filter and the color wheel may be reduced. Moreover, the fabrication cost may also be reduced. In addition, the vibration and noise caused by the color wheel may be reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A coating method for a color filter, comprising the steps of:
   coating a first photoresist layer on a substrate;
   forming at least an aligning pattern and a first color film pattern on the first photoresist layer by exposure and development;
   coating a first dye on the aligning pattern and the first color film pattern;
   stripping the first photoresist layer;
   coating a second photoresist layer on the substrate, wherein the aligning pattern and the first color film pattern are formed on the substrate;
   aligning position by using the aligning pattern of the substrate;
   forming a second color film pattern on the second photoresist layer by exposure and development;
   coating a second dye on the second color film pattern;
   stripping the second photoresist layer;
   forming a third photoresist layer on the substrate, wherein the aligning pattern, the first color film pattern and the second color film pattern are formed on the substrate; and
   aligning position by using the aligning pattern of the substrate, then forming a third color film pattern on the third photoresist layer by exposure and development, wherein the aligning pattern is located at the relative center of the first color film pattern, the second color film pattern and the third color film pattern, the aligning pattern includes two sector patterns located opposite to each other.

2. The coating method of claim 1, further comprising:
   coating a third dye on the third color film pattern.

3. The coating method of claim 2, further comprising:
   stripping the third photoresist layer.

4. A coating method for a color filter, comprising the steps of:
   coating a first photoresist layer on a substrate;
   forming at least an aligning pattern and a first color film pattern on the first photoresist layer by exposure and development;
   coating a first dye on the aligning pattern and the first color film pattern;
   stripping the first photoresist layer;
   coating a second photoresist layer on the substrate, wherein the aligning pattern and the first color film pattern are formed on the substrate;
   aligning position by using the aligning pattern of the substrate;
   forming a second color film pattern on the second photoresist layer by exposure and development, wherein the aligning pattern is located at the relative center of the first color film pattern and the second color film pattern;
   coating a second dye on the second color film pattern; and
   stripping the second photoresist layer, wherein the aligning pattern includes two sector patterns located opposite to each other.

5. The coating method of claim 4, further comprising:
   forming a third photoresist layer on the substrate, wherein the aligning pattern, the first color film pattern and the second color film pattern are formed on the substrate.

6. The coating method of claim 5, further comprising:
   aligning position by using the aligning pattern of the substrate, then forming a third color film pattern on the third photoresist layer by exposure and development.

7. The coating method of claim 6, further comprising:
coating a third dye on the third color film pattern.

8. The coating method of claim 7, further comprising:
stripping the third photoresist layer.

9. A coating method for a color filter of a color wheel, comprising the steps of:
coating a first photoresist layer on a substrate;
forming at least an aligning pattern and a first color film pattern on the first photoresist layer by exposure and development;
coating a first dye on the aligning pattern and the first color film pattern;
stripping the first photoresist layer;
coating a second photoresist layer on the substrate, wherein the aligning pattern and the first color film pattern are formed on the substrate;
aligning position by using the aligning pattern of the substrate;
forming a second color film pattern on the second photoresist layer by exposure and development, wherein the aligning pattern is located at the relative center of the first color film pattern and the second color film pattern;
coating a second dye on the second color film pattern; and
stripping the second photoresist layer, wherein the aligning pattern includes a cross pattern.

10. The coating method of claim 9, further comprising:
forming a third photoresist layer on the substrate, wherein the aligning pattern, the first color film pattern and the second color film pattern are formed on the substrate.

11. The coating method of claim 10, further comprising:
aligning position by using the aligning pattern of the substrate, then forming a third color film pattern on the third photoresist layer by exposure and development.

12. The coating method of claim 11, further comprising:
coating a third dye on the third color film pattern.

13. The coating method of claim 12, further comprising:
stripping the third photoresist layer.

* * * * *